United States Patent
Chien (10) Patent No.: US 7,170,965 B2
(45) Date of Patent: Jan. 30, 2007

(54) LOW NOISE DIVIDER MODULE FOR USE IN A PHASE LOCKED LOOP AND OTHER APPLICATIONS

(75) Inventor: Hung-Ming (Ed) Chien, Los Angeles, CA (US)

(73) Assignee: Broadcom Corporation, Irvine, CA (US)

( * ) Notice: Subject to any disclaimer, the term of this patent is extended or adjusted under 35 U.S.C. 154(b) by 770 days.

(21) Appl. No.: 10/406,178

(22) Filed: Apr. 3, 2003

(65) Prior Publication Data

US 2004/0196940 A1    Oct. 7, 2004

(51) Int. Cl.
*H03D 3/24* (2006.01)

(52) U.S. Cl. ............... 375/376; 455/260; 327/536; 327/147; 327/156; 327/159

(58) Field of Classification Search .......... 375/376; 455/260; 327/536, 147, 156, 159
See application file for complete search history.

(56) References Cited

U.S. PATENT DOCUMENTS

| | | | | |
|---|---|---|---|---|
| 3,341,845 A | * | 9/1967 | Deman | 342/44 |
| 5,446,767 A | * | 8/1995 | Nakagawa et al. | 375/376 |
| 5,519,887 A | * | 5/1996 | Lieu | 455/266 |
| 5,764,711 A | * | 6/1998 | Jokura | 375/376 |
| 5,953,386 A | * | 9/1999 | Anderson | 375/376 |
| 6,008,703 A | * | 12/1999 | Perrott et al. | 332/100 |
| 6,366,174 B1 | * | 4/2002 | Berry et al. | 331/78 |
| 6,643,499 B1 | * | 11/2003 | Audinot et al. | 455/260 |
| 7,042,257 B2 | * | 5/2006 | Wang | 327/115 |

* cited by examiner

*Primary Examiner*—Jean B. Corrielus
*Assistant Examiner*—Nader Bolourchi
(74) *Attorney, Agent, or Firm*—Garlick Harrison & Markison; Timothy W. Markison; Bruce E. Stuckman (57) ABSTRACT

A low noise divider module includes a divider chain and a retiming module. The divider chain includes a plurality of cascaded dividers and a plurality of load logic gates. The plurality of cascaded dividers are operably coupled to divide an input oscillation by a divider value, which is programmable, to produce a divided output oscillation based on the load signals provided by the logic gates. The retiming module includes a duty cycle module and a jitter reduction module. The duty cycle module is coupled to produce a duty cycle controlled output oscillation based on a representation of the divided output oscillation produced by the divider chain in accordance with a duty cycle setting signal. The jitter reduction module is operably coupled to produce a low jitter output oscillation from the duty cycle controlled output oscillation based on the input oscillation and the duty cycle setting signal.

18 Claims, 7 Drawing Sheets

FIG. 3
local oscillation module 74

FIG. 4
divider module 108

FIG. 5
divider module 108

FIG. 6
timing diagram of divider module 108

FIG. 7
timing diagram of
retiming module 170

LOW NOISE DIVIDER MODULE FOR USE IN A PHASE LOCKED LOOP AND OTHER APPLICATIONS

BACKGROUND OF THE INVENTION

1. Technical Field of the Invention

This invention relates generally to phase locked loops and more particularly to divider modules used within phase locked loops.

2. Description of Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

As is also known, the receiver is coupled to the antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

The local oscillations used in both the transmitter and receiver may be produced by the same or different local oscillation generators. In either case, a local oscillator generator is typically implemented using a fractional N-synthesizer. As is known, a fractional N-synthesizer has a phase lock loop (PLL) topology that allows for fractional adjustments of the feedback oscillation via a feedback fractional N divider. As is also known, the fractional adjustments of the fractional N divider allow for fine tuning of the local oscillation such that, for example, a particular channel may be tuned, a particular intermediate frequency may be achieved, et cetera.

While a fractional-N synthesizer allows for fine-tuning of a local oscillation, its accuracy is limited by the linearity of its components. As is known, a fractional-N synthesizer includes a phase and frequency detector, a charge pump, a loop filter, a voltage controlled oscillator and a divider module. The divider module may be implemented in a variety of ways, but one popular way is to include a plurality of cascaded divide by 2 or divide by 3 blocks, where triggering of the divide by 2 or divide by 3 blocks is gated by a plurality of cascaded AND gates. An issue with this type of divider is that the jitter from each divider block is accumulated throughout the divider module. This accumulated jitter raises the phase noise at the output of the divider module. As such, such a divider module injects an unacceptable amount of noise for many high performance applications.

One solution for reducing the phase noise produced by such a divider module is to add a retiming flip-flop at the output of the divider blocks. While this reduces jitter, and hence reduces phase noise, the delays of each block are accumulated, which results in stability issues and/or cycle slipping of the flip-flop for high input clocks.

Therefore, a need exists for a divider module that has minimal jitter, is stable, and avoids cycle slipping.

BRIEF SUMMARY OF THE INVENTION

The low noise divider module of the present invention substantially meets these needs and others. An embodiment of a low noise divider module includes a divider chain and a retiming module. The divider chain includes a plurality of cascaded dividers and a plurality of load logic gates. The plurality of cascaded dividers are operably coupled to divide an input oscillation by a divider value, which is programmable, to produce a divided output oscillation based on the load signals provided by the logic gates. The retiming module includes a duty cycle module and a jitter reduction module. The duty cycle module is coupled to produce a duty cycle controlled output oscillation based on a representation of the divided output oscillation produced by the divider chain in accordance with a duty cycle setting signal. The jitter reduction module is operably coupled to produce a low jitter output oscillation from the duty cycle controlled output oscillation based on the input oscillation and the duty cycle setting signal. As such, a divider module is achieved that has minimal jitter, is stable and avoids cycle slipping of retiming correction circuitry.

DETAILED DESCRIPTION OF THE INVENTION

Figure 1:
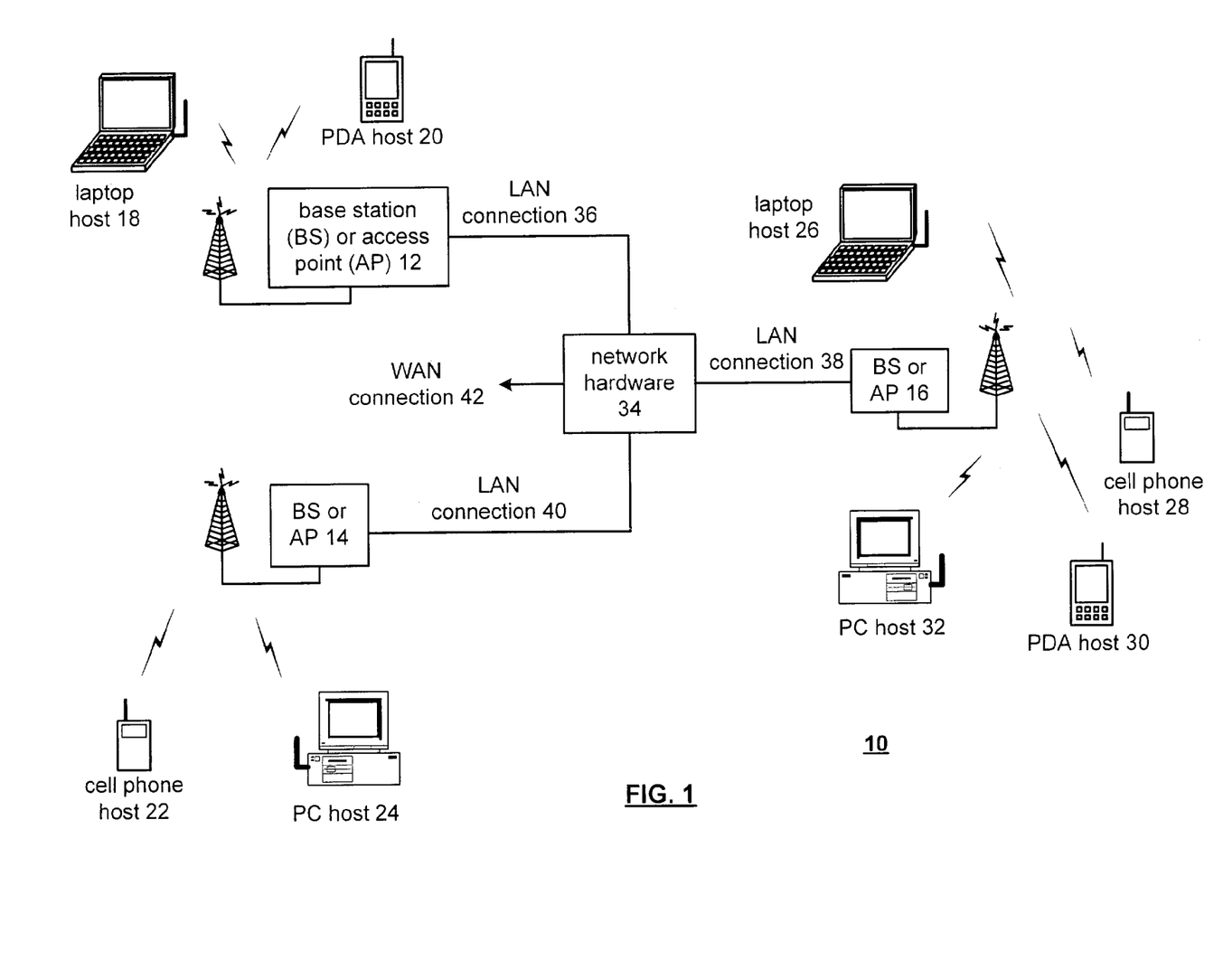
FIG. 1 is a schematic block diagram of a wireless communication system in accordance with the present invention.

FIG. 1 is a schematic block diagram illustrating a communication system 10 that includes a plurality of base stations and/or access points 12–16, a plurality of wireless communication devices 18–32 and a network hardware component 34. The wireless communication devices 18–32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12–16 are operably coupled to the network hardware 34 via local area network connections 36, 38 and 40. The network hardware 34, which may be a router, switch, bridge, modem, system controller, et cetera provides a wide area network connection 42 for the communication system 10. Each of the base stations or access points 12–16 has an associated antenna or antenna array to communicate with the wireless communication devices in its area. Typically, the wireless communication devices register with a particular base station or access point 12–14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifier and/or programmable multi-stage amplifier as disclosed herein to enhance performance, reduce costs, reduce size, and/or enhance broadband applications.

Figure 2:
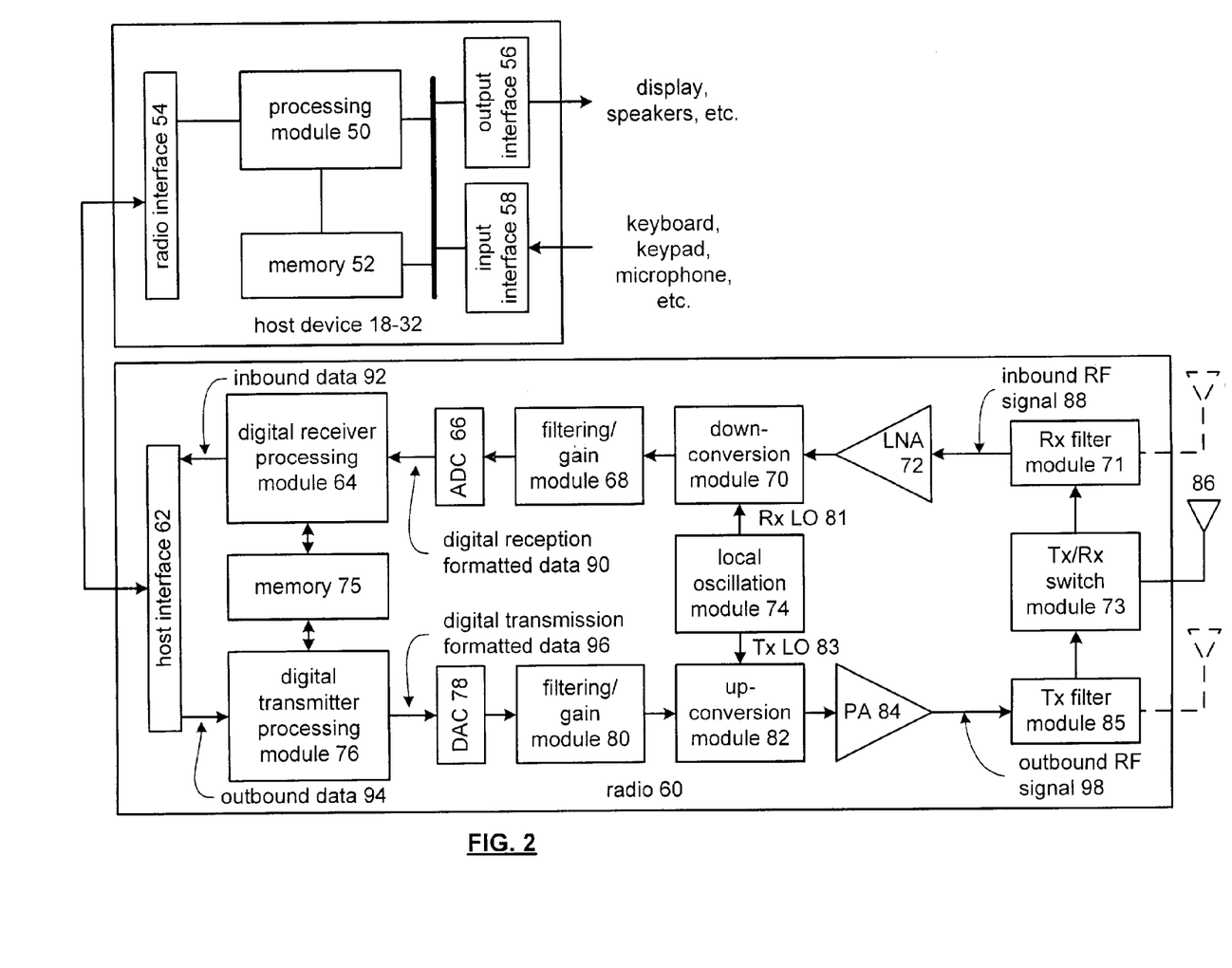
FIG. 2 is a schematic block diagram of a wireless communication device in accordance with the present invention.

FIG. 2 is a schematic block diagram illustrating a wireless communication device that includes the host device 18–32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18–32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, digital receiver processing module 64, an analog-to-digital converter 66, a filtering/attenuation module 68, an IF mixing down conversion stage 70, a receiver filter 71, a low noise amplifier 72, a transmitter/receiver switch 73, a local oscillation module 74, memory 75, a digital transmitter processing module 76, a digital-to-analog converter 78, a filtering/gain module 80, an IF mixing up conversion stage 82, a power amplifier 84, a transmitter filter module 85, and an antenna 86. The antenna 86 may be a single antenna that is shared by the transmit and receive paths as regulated by the Tx/Rx switch 73, or may include separate antennas for the transmit path and receive path. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE 802.11a, IEEE 802.11b, Bluetooth, et cetera) to produce digital transmission formatted data 96. The digital transmission formatted data 96 will be a digital base-band signal or a digital low IF signal, where the low IF typically will be in the frequency range of one hundred kilohertz to a few megahertz.

The digital-to-analog converter 78 converts the digital transmission formatted data 96 from the digital domain to the analog domain. The filtering/gain module 80 filters and/or adjusts the gain of the analog signal prior to providing it to the IF mixing stage 82. The IF mixing stage 82 directly converts the analog baseband or low IF signal into an RF signal based on a transmitter local oscillation 83 provided by local oscillation module 74, which may be implemented in accordance with the teachings of the present invention. The power amplifier 84 amplifies the RF signal to produce outbound RF signal 98, which is filtered by the transmitter filter module 85. The antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the Tx/Rx switch 73, where the Rx filter 71 bandpass filters the inbound RF signal 88. The Rx filter 71 provides the filtered RF signal to low noise amplifier 72, which amplifies the signal 88 to produce an amplified inbound RF signal. The low noise amplifier 72 provides the amplified inbound RF signal to the IF mixing module 70, which directly converts the amplified inbound RF signal into an inbound low IF signal or baseband signal based on a receiver local oscillation 81 provided by local oscillation module 74, which may be implemented in accordance with the teachings of the present invention. The down conversion module 70 provides the inbound low IF signal or baseband signal to the filtering/gain module 68. The filtering/gain module 68 filters and/or gains the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18–32 via the radio interface 54.

As one of average skill in the art will appreciate, the wireless communication device of FIG. 2 may be implemented using one or more integrated circuits. For example, the host device may be implemented on one integrated circuit, the digital receiver processing module 64, the digital transmitter processing module 76 and memory 75 may be implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver and transmitter processing modules 64 and 76 may be a common processing device implemented on a single integrated circuit. Further, the memory 52 and memory 75 may be implemented on a single integrated circuit and/or on the same integrated circuit as the common processing modules of processing module 50 and the digital receiver and transmitter processing module 64 and 76.

Figure 3:
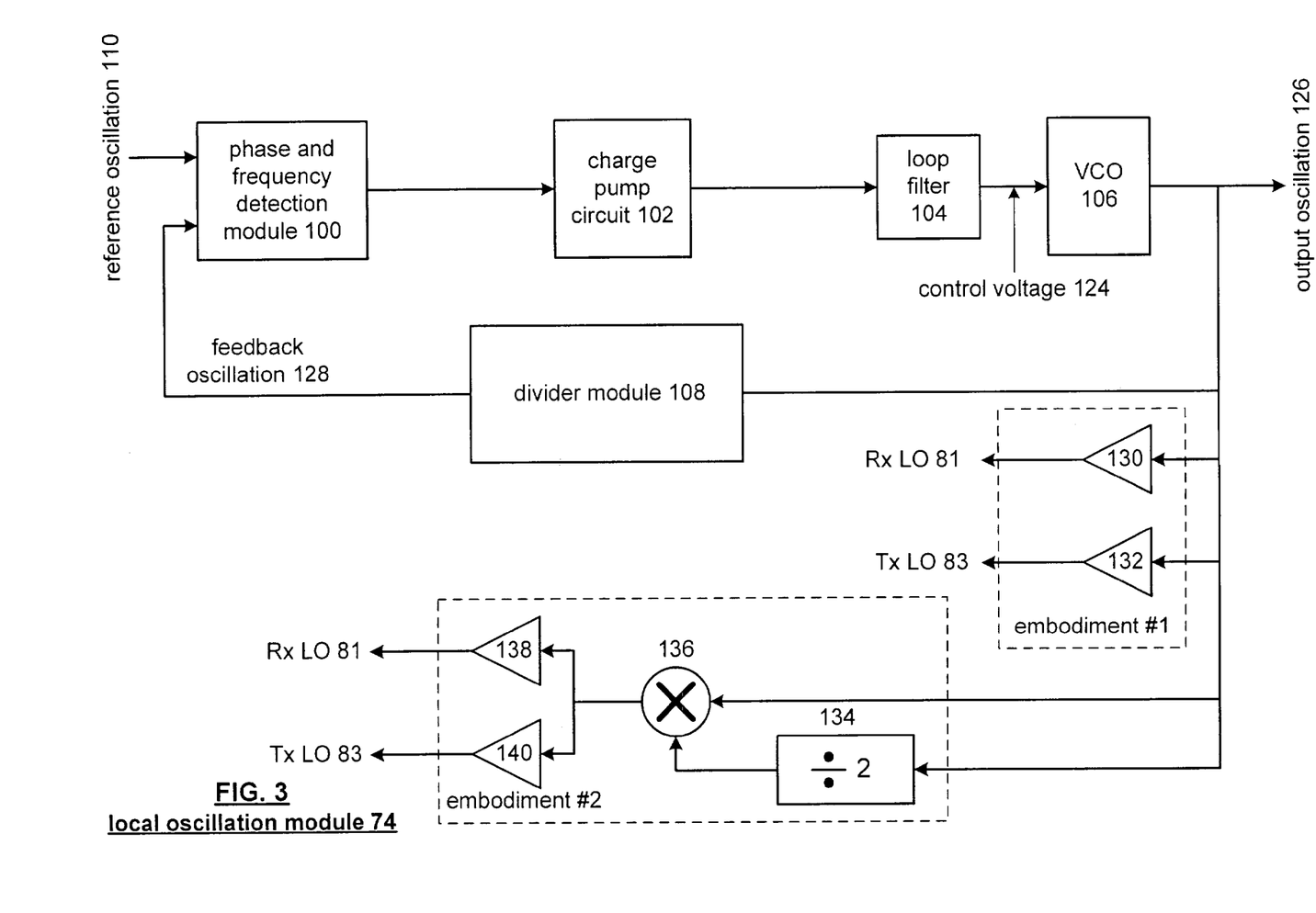
FIG. 3 is a schematic block diagram of a local oscillation module in accordance with the present invention.

FIG. 3 illustrates an embodiment of the local oscillation module 74 that includes a phase and frequency detection module 100, a charge pump circuit 102, a loop filter 104, a voltage controlled oscillator (VCO) 106, and a divider module 108, which may be a fractional-N divider module. The receiver local oscillation 81 and the transmitter local oscillation 83 may be generated from the output oscillation 128 in a variety of embodiments. In one embodiment, the receiver local oscillation 81 and the transmitter local oscillation 83 are directly produced from the output oscillation 126 via buffers 130 and 132. As one of average skill in the art will appreciate, an I and Q component for the receiver local oscillation 81 and the transmitter local oscillation 83 may be obtained by phase shifting the I components of the local oscillations 81 and 83 by 90°.

In an alternate embodiment, the receiver local oscillation 81 and transmitter local oscillation 83 may be produced by a plurality of logic gates. As shown, the output oscillation 126 may be divided via a divide by 2 module 134 and then multiplied via multiplier 136. The resulting oscillation from multiplier 136 has a frequency that is 1½ times the output oscillation 126. From this increased oscillation the receiver local oscillation 81 and transmitter local oscillation 83 are derived via buffers 138 and 140. As one of average skill in the art will appreciate, the output oscillation 126 may be phase shifted by 90° and the logic circuitry repeated to produce a Q component for the receiver local oscillation 81 and a Q component for the transmit local oscillation 83.

The phase and frequency detection module 100 is operably coupled to receive a reference oscillation 110 and a feedback oscillation 128. The reference oscillation 110 may be produced by a crystal oscillator and/or another type of clock source. The phase and frequency detection module 100 produces a charge-up signal 112 when the phase and/or frequency of the feedback oscillation 128 lags the phase and/or frequency of the reference oscillation 110. In this condition, the output oscillation 126 is at a frequency below its desired rate. The phase and frequency detection module 100 generates the charge down signal 114 when the phase and/or frequency of the feedback oscillation 128 leads the phase and/or frequency of the reference oscillation 110. In this condition, the output oscillation 126 is above its desired rate. The phase and frequency detection module 100 produces the off signal 116 when the phase and/or frequency of the feedback oscillation 128 is aligned with the phase and/or frequency of the reference oscillation 110. In addition, the phase and/or frequency detection module 100 produces the off signal 116 when not producing the charge-up signal or charge-down signal.

The charge pump circuit 102 receives the charge-up signal 112, the charge-down signal 114 and the off signal 116. In response to the charge-up signal 112, the charge pump 102 produces a positive current 118, in response to the charge-down signal 114, the charge pump circuit 102 produces a negative current 120, and in response to the off signal produces a zero current.

The loop filter 104 receives the positive current 118, negative current 120 and non-zero offset current 122 and produces therefrom a control voltage 124. The loop filter 104 provides the control voltage 124 to the voltage control oscillator 106. The voltage control oscillator 106 generates the output oscillation 126 based on the control voltage 124.

The divider module 108, which will be described in greater detail with reference to FIGS. 4–7, divides the output oscillation 126 by a divider value to produce the feedback oscillation 128.

Figure 4:
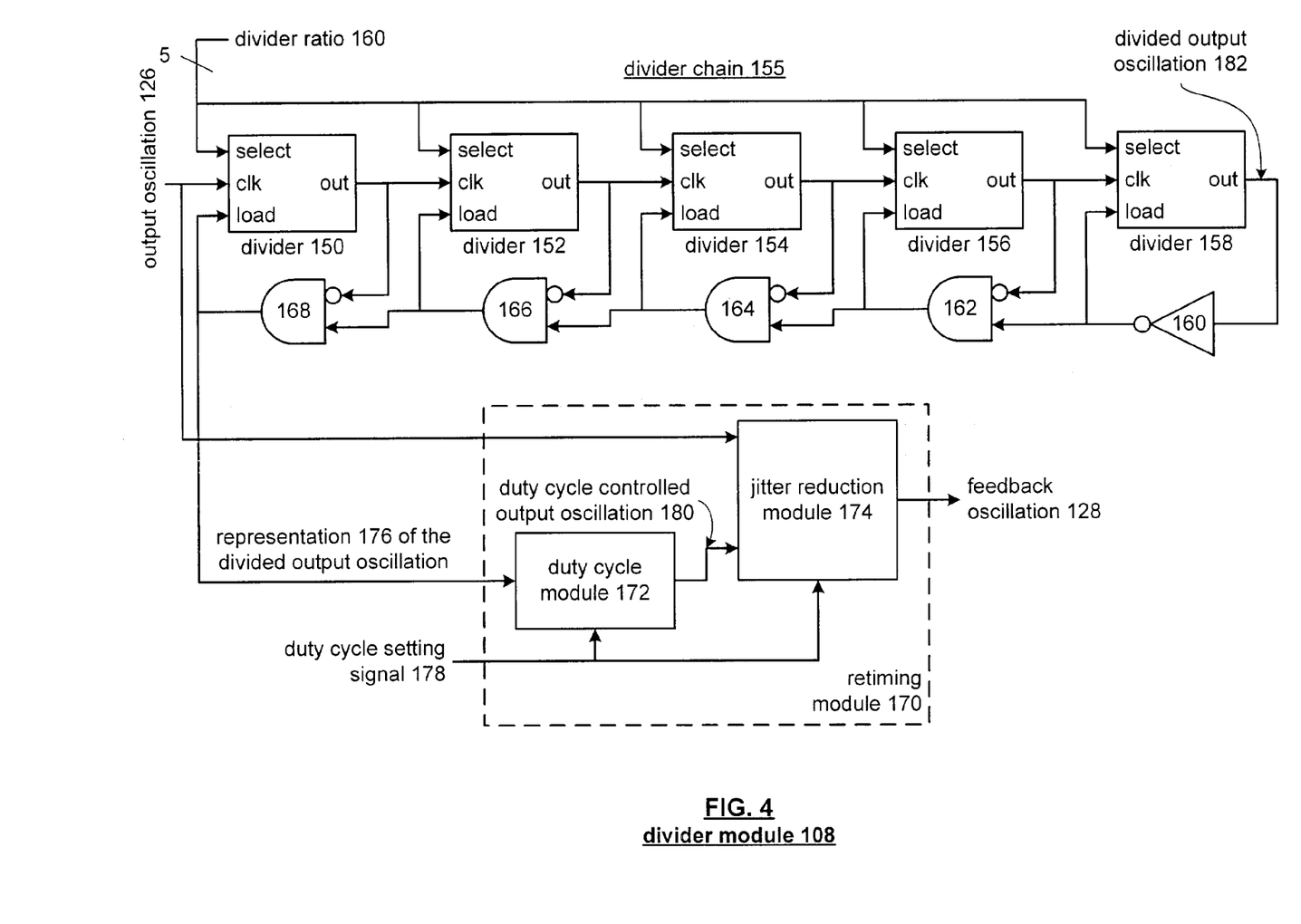
FIG. 4 is a schematic block diagram of a divider module in accordance with the present invention.

FIG. 4 is a schematic block diagram of divider module 108 that includes a divider chain 155 and a retiming module 170. The divider chain includes a plurality of programmable dividers 150–158, an inverter 160 and a plurality of AND gates 162–168. The inverter 160 and AND gates 162–168 comprise a plurality of logic gates. The retiming module 170 includes a duty cycle module 172 and a jitter reduction module 174.

In operation, the divider chain 155 is programmed in accordance with a divider ratio 160, or divider value. For example, each of the dividers 150–158 may be a divide by 2 or divide by 3 module. Based on the corresponding divider ratio 160, each divider 150–158 will be programmed to divide its input clock by a factor of 2 or a factor of 3. In this example, the minimum divider ratio is $2^5$, which equals 32 and the maximum divider ration is $2^5+2^4+2^3+2^2+2^1+2^0=63$. The divider ratio may be programmed as a code where the divider ratio $N=32+D4\times2^4+D3\times2^3+D2\times2^2+D1\times2^1+D0$, where D0–D4 correspond to the 5 bits of divider ratio 160. For example, to achieve a divider ratio of 43, the divider ratio 160 will be programmed to a digital value of 01011, which translates to the $1^{st}$, $2^{nd}$ and $4^{th}$ divider modules performing a divide by 3 one time.

As illustrated, the input of divider module 180 corresponds to the output oscillation 126. Based on the divider ratio 160, the divider modules 150–158 divide the output oscillation 126 to produce a divided output oscillation 182. Accordingly, for a 5 stage divider module, the divided output oscillation 182 may be $\frac{1}{32}^{nd}$ to $\frac{1}{63}^{rd}$ the rate of the output oscillation 126. The plurality of logic gates inverter 160 and AND gates 162–168 control the loading of the divider ratio 160 into the corresponding divider modules.

The duty cycle module 172, of retiming module 170, receives a representation 176 of the divided output oscillation 182 and, based on a duty cycle setting signal 178, produces a duty cycle controlled output oscillation 180. The jitter reduction module 174, based on the input oscillation of the divider module 108 and on the duty cycle setting signal 178, which corresponds to the output oscillation 126, produces the feedback oscillation 128, which is a low jitter output oscillation of divider module 108.

In general, the signals that traverse the feedback path of the plurality of logic gates pass without accumulating the delay of the corresponding dividers. For example, to generate the output of AND gate 162, both inputs to AND gate 162 need to be high. Since the output of the inverter 160 will always be high earlier than the output of divider module 156, the delay of the output of AND gate 162 relative to the output of divider 156 is only one AND gate delay. This applies to each of the divider stages. Accordingly, the delay from the output of AND gate 168 with respect to the input clock, (i.e., the output oscillation 126) is only the delay of one flip-flop and one AND gate. As such, the output of AND gate 168 can be retimed by the input clock, (i.e., the output oscillation 126) with much higher frequency compared with the prior art embodiments. In particular, the retimed output of AND gate 168 may be used as the output of the divider module, however, it has a relatively small duty cycle. As such, for most applications, the duty cycle module 172 expands the corresponding duty cycle to produce a more acceptable feedback signal.

Figure 5:
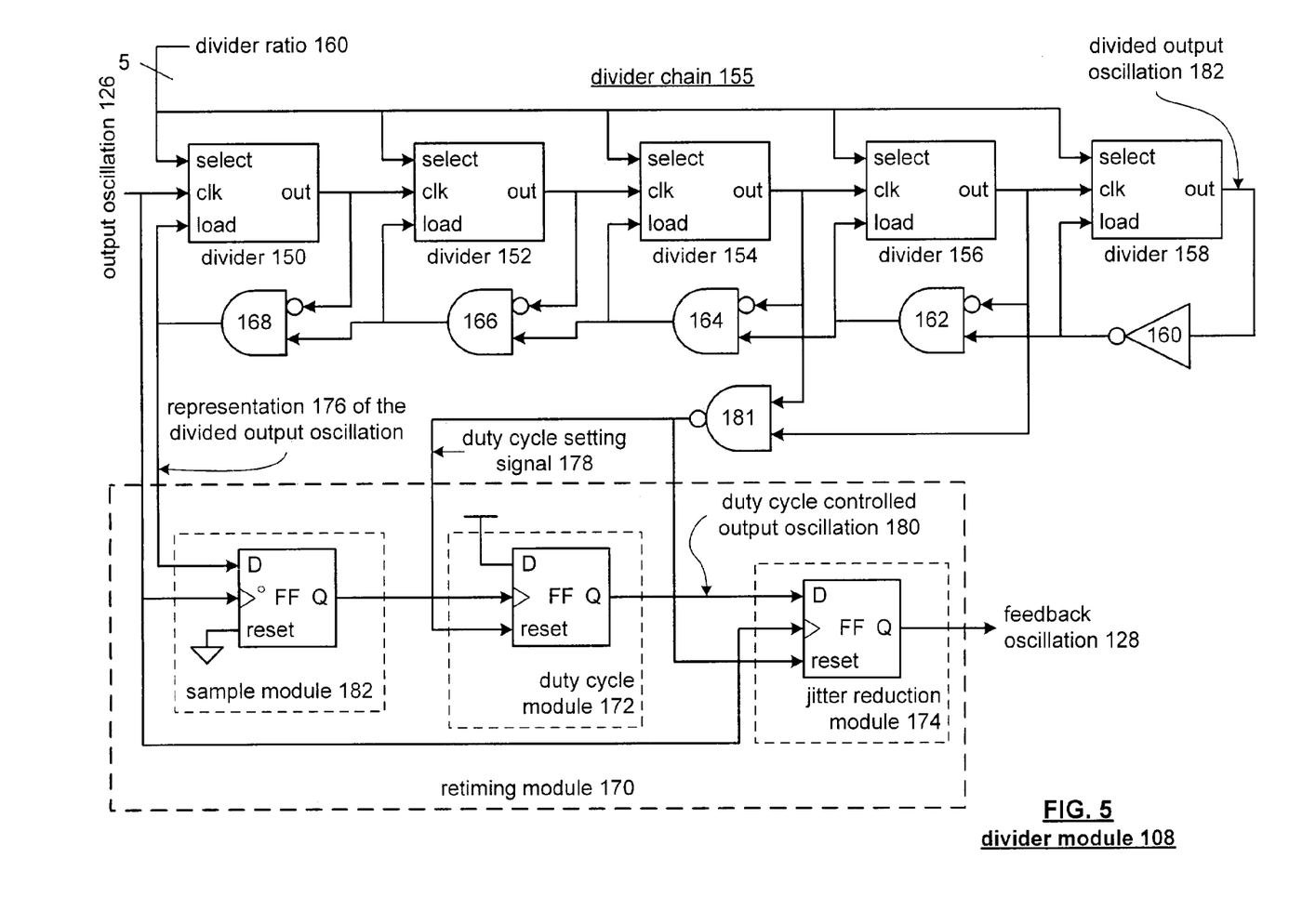
FIG. 5 is a schematic block diagram of an alternate divider module in accordance with the present invention.

FIG. 5 is a schematic block diagram of another embodiment of divider module 108. In this embodiment, the divider module 108 includes the divider chain 155 and the retiming module 170. The divider chain 155 is as previously discussed with reference to FIG. 4. The retiming module 170 includes a sample module 182, the duty cycle module 172 and the jitter reduction module 174. In addition, the duty cycle setting signal 178 is produced by NAND gate 181.

Each of the sample module 182, duty cycle module 172 and jitter reduction module 174 may be implemented by a flip-flop circuit. As shown, the sample module 182 samples the representation 176 of the divided output oscillation 182 based on a clock signal corresponding to the output oscillation 126. The resulting sampled signal is used as the clock input to the duty cycle module 172. The duty cycle module 172 is reset based on the duty cycle setting signal 178. The duty cycle controlled output oscillation 180 is feed as the input to the jitter reduction module flip-flop, which is clocked based on the output oscillation 126 to produce the feedback oscillation 128. Accordingly, the retiming module 170 prevents the accumulation of the jitter induced by the divider modules, reduces propagation delay to a single AND gate and/or a flip-flop delay such that the delay of the various stages is not accumulated, and as such, produces a stable divider module.

Figure 6:
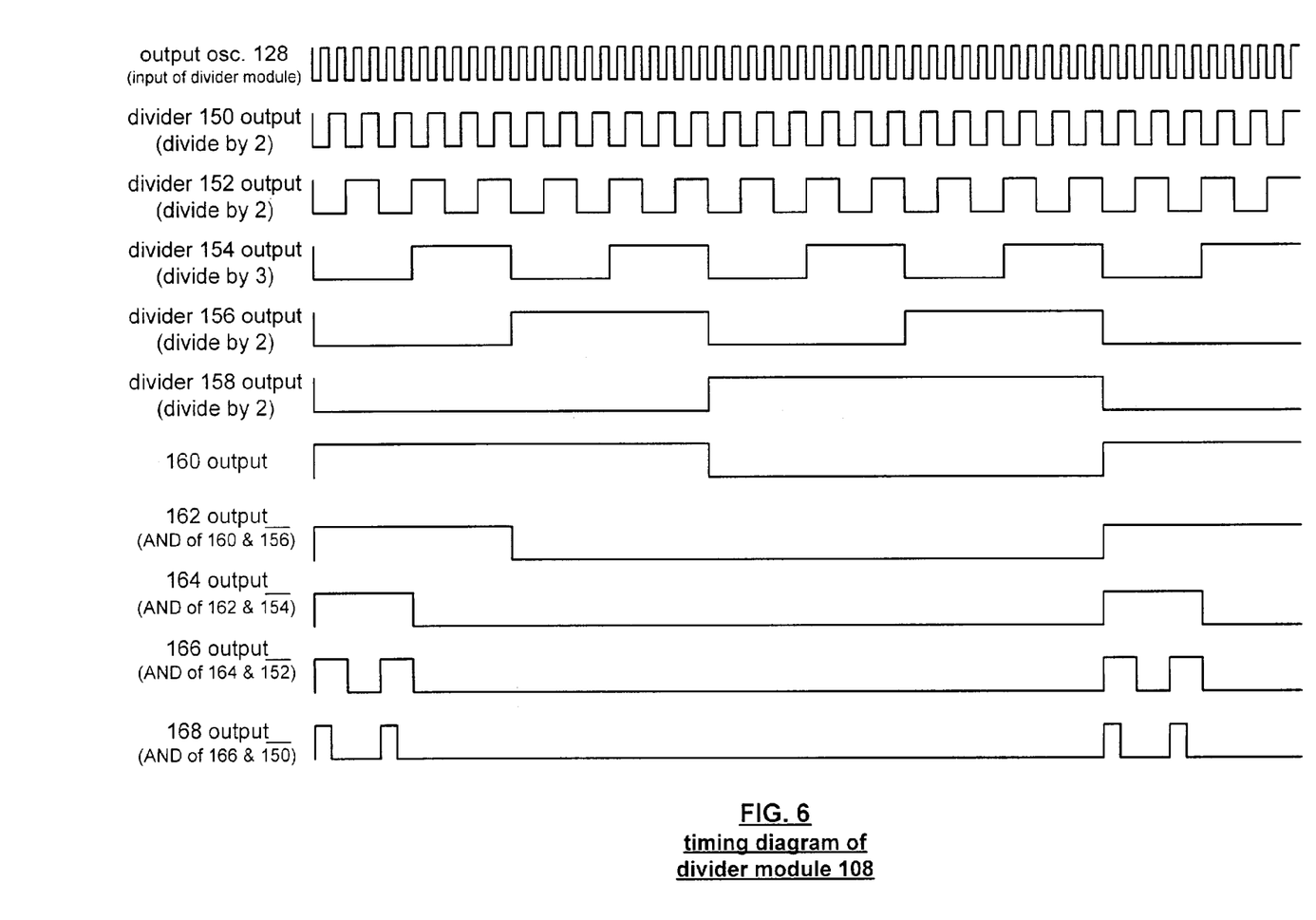
FIG. 6 is a timing diagram of the divider module in accordance with the present invention.

FIG. 6 is a timing diagram of the divider module 108. As shown, the output oscillation 128 corresponds to the input of the divider module and has a greater rate than the remaining divided signals produced. The output of divider modules 150 and 152 produce a corresponding divide by 2 signal. In this example, divider 154 is producing a divide by 3 response and remaining dividers 156 and 158 are producing a divide by 2 response. Accordingly, the corresponding divided output oscillation 182 is produced by divider 158. The timing of the logic gates begins with the output of inverter 160, which corresponds to the inversion of the divider 158. The corresponding output of AND gates 162–168 are shown. As previously discussed, the delay for each retriggering of the dividers corresponds to essentially one AND gate delay.

Figure 7:
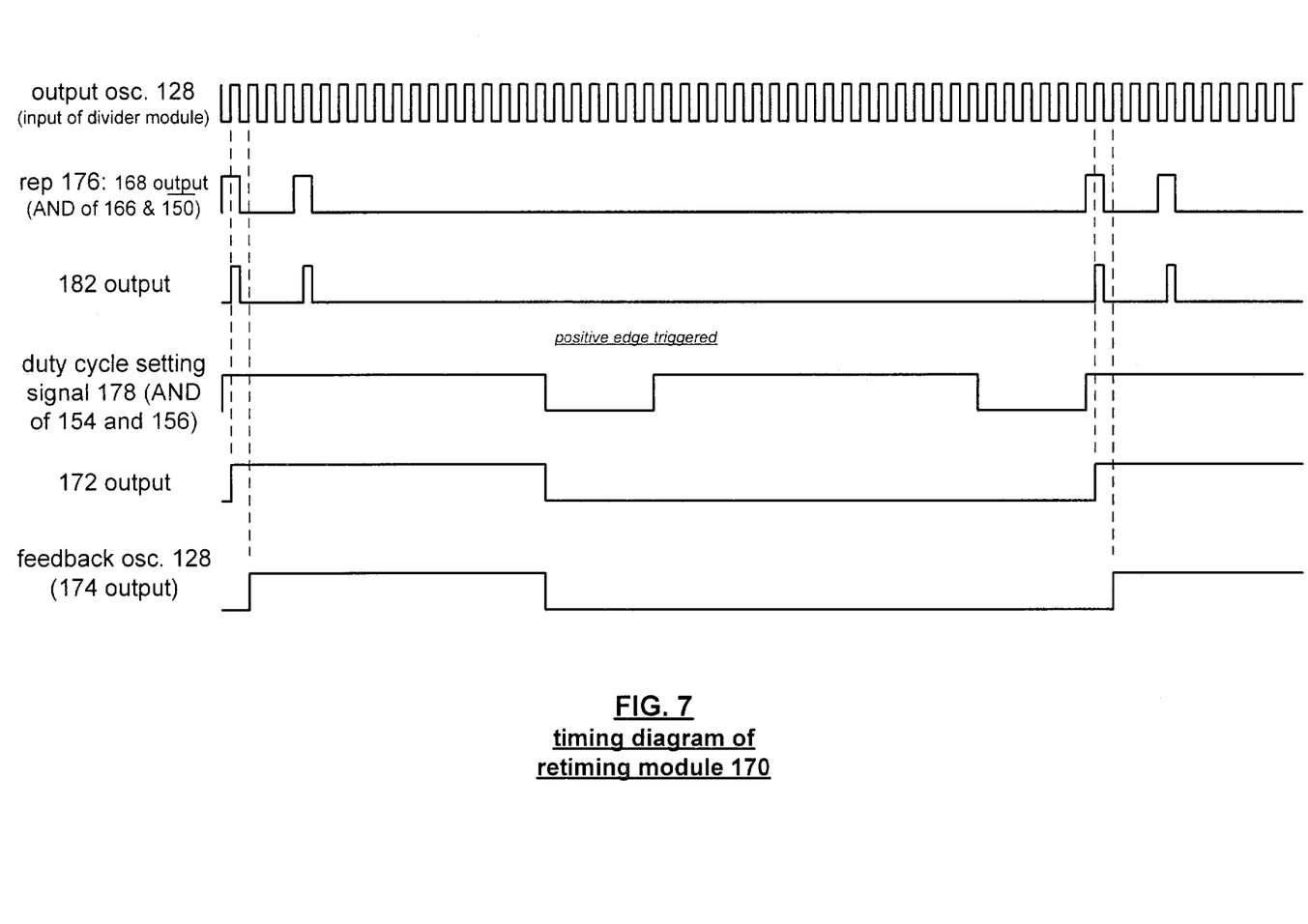
FIG. 7 is a timing diagram of the operation of a retiming module in accordance with the present invention.

FIG. 7 is a timing diagram of the retiming module 170. In this example, the output oscillation, which corresponds to the input of the divider module, is at a first rate. The representation 176 of the divided output oscillation 182 is produced by the output of AND gate 168. The corresponding signal is then used to trigger the output of the sample module flip-flop 182. The duty cycle setting signal 178, which is a NAND function of 154 and 156, is illustrated and establishes the corresponding duty cycle of the feedback oscillation 128. As shown, the resulting feedback oscillation is triggered based on the output oscillation 128, which is at a much higher rate and, as previously discussed, does not include the corresponding accumulation of jitter and/or delays. As such, the resulting feedback oscillation is low noise and low delay such that it is stable and does not incur cycle slippage.

The timing diagrams of FIGS. 6 and 7 are illustrative examples that are included to describe the functionality of the present invention, however, the timing diagrams are not intended to be exact representations of the signaling within the various embodiments of the present invention. As one of average skill in the art will appreciate, the embodiments illustrated in FIGS. 3–5 may be simulated to obtain accurate timing relationships of the signals.

The preceding discussion has presented a divider module that may be used in a phase locked loop that produces a low jitter divider output. As one of average skill in the art will appreciate, other embodiments may be derived from the teaching of the present invention without deviating from the scope of the claims.

What is claimed is:

1. A low noise divider module comprises:
   divider chain that includes a plurality of cascaded dividers and a plurality of load logic gates, wherein the plurality of cascaded dividers are operably coupled to divide an input oscillation by a divider value to produce a divided output oscillation based on load signals provided by the plurality of load logic gates; and
   retiming module operably coupled to provide a low noise output oscillation based on the divider output oscillation, wherein the retiming module includes:
      duty cycle module operably coupled to produce a duty cycle controlled output oscillation based on a representation of the divided output oscillation and a duty cycle setting signal; and
      jitter reduction module operably coupled to produce a low jitter output oscillation from the duty cycle controlled output oscillation based on the input oscillation and the duty cycle setting signal.

2. The low noise divider module of claim 1, wherein the retiming module further comprises:
   sample module operably coupled to sample an output of a last one of the plurality off load logic gates based on the input oscillation to produce a low delay pulse train having a rate that corresponds to a rate of the divided output oscillation, wherein the sample module provides the low delay pulse train to the duty cycle module as the representation of the divided output oscillation.

3. The low noise divider module of claim 2, wherein the duty cycle module further comprises:
   a flip-flop having a data input, an output, a clock input, and a reset input, wherein the data input of the flip-flop is coupled to a logic one source, wherein the clock input is coupled to receive the low delay pulse train, and the reset input is operably coupled to receive the duty cycle setting signal.

4. The low noise divider module of claim 2, wherein the sample module further comprises:
   a flip-flop having a data input, an output and a clock input, wherein the data input is operably coupled to receive the output of a last one of the plurality of load logic gates, the clock input is coupled to receive the input oscillation.

5. The low noise divider module of claim 2, wherein the jitter reduction module further comprises:
   flip-flop having a data input, an output, a clock input, and a reset input, wherein the data input is coupled to receive the duty cycle controlled output oscillation, the clock input is coupled to receive the input oscillation, and the reset input is coupled to receive the duty cycle setting signal.

6. The low noise divider module of claim 1, wherein the retiming module further comprises:
   logic circuitry operably coupled to produce the duty cycle setting signal based on output of at least one intermediary load logic gate of the plurality of load logic gates.

7. A phase locked loop (PLL) comprises:
   difference detector operably coupled to determine a difference signal based on a reference oscillation and a feedback oscillation;
   charge pump operably coupled to generate a charge current based on the difference signal and a scaling signal;
   loop filter operably coupled to convert the charge current into a control voltage;
   voltage controlled oscillator operably coupled to generate an output oscillation based on the control voltage;
   divider module operably coupled to generate the feedback oscillation based on the output oscillation and a divider value, wherein the divider module includes:
      divider chain that includes a plurality of cascaded dividers and a plurality of load logic gates, wherein the plurality of cascaded dividers are operably coupled to divide an input oscillation by a divider value to produce a divided output oscillation based on load signals provided by the plurality of load logic gates; and
      retiming module operably coupled to provide a low noise output oscillation based on the divider output oscillation, wherein the retiming module includes:
         duty cycle module operably coupled to produce a duty cycle controlled output oscillation based on a representation of the divided output oscillation and a duty cycle setting signal; and
         jitter reduction module operably coupled to produce a low jitter output oscillation from the duty cycle controlled output oscillation based on the input oscillation and the duty cycle setting signal; and
   scaling module operably coupled to produce the scaling signal based on a selected divider value.

8. The PLL of claim 7, wherein the retiming module further comprises:
   sample module operably coupled to sample an output of a last one of the plurality of load logic gates based on the input oscillation to produce a low delay pulse train having a rate that corresponds to a rate of the divided output oscillation, wherein the sample module provides the low delay pulse train to the duty cycle module as the representation of the divided output oscillation.

9. The PLL of claim 8, wherein the duty cycle module further comprises:
   a flip-flop having a data input, an output, a clock input, and a reset input, wherein the data input of the flip-flop is coupled to a logic one source, wherein the clock input is coupled to receive the low delay pulse train, and the reset input is operably coupled to receive the duty cycle setting signal.

10. The PLL of claim 8, wherein the sample module further comprises:
    a flip-flop having a data input, an output and a clock input, wherein the data input is operably coupled to receive the output of a last one of the plurality of load logic gates, the clock input is coupled to receive the input oscillation.

11. The PLL of claim 8, wherein the jitter reduction module further comprises:
    flip-flop having a data input, an output, a clock input, and a reset input, wherein the data input is coupled to receive the duty cycle controlled output oscillation, the clock input is coupled to receive the input oscillation, and the reset input is coupled to receive the duty cycle setting signal.

12. The PLL of claim 7, wherein the retiming module further comprises:
    logic circuitry operably coupled to produce the duty cycle setting signal based on output of at least one intermediary load logic gate of the plurality of load logic gates.

13. A radio frequency integrated circuit (RFIC) comprises:
    transmitter section operably coupled to convert outbound data into outbound radio frequency (RF) signals based on a transmitter local oscillation;

receiver section operably coupled to convert inbound RF signals into inbound data based on a receiver local oscillation; and local oscillator operably coupled to produce the transmitter local oscillation and the receiver local oscillation, wherein the local oscillator includes:

difference detector operably coupled to determine a difference signal based on a reference oscillation and a feedback oscillation;

charge pump operably coupled to generate a charge current based on the difference signal and a scaling signal;

loop filter operably coupled to convert the charge current into a control voltage;

voltage controlled oscillator operably coupled to generate an output oscillation based on the control voltage;

divider module operably coupled to generate the feedback oscillation based on the output oscillation and a divider value, wherein the divider module includes:

divider chain that includes a plurality of cascaded dividers and a plurality of load logic gates, wherein the plurality of cascaded dividers are operably coupled to divide an input oscillation by a divider value to produce a divided output oscillation based on load signals provided by the plurality of load logic gates; and retiming module operably coupled to provide a low noise output oscillation based on the divider output oscillation, wherein the retiming module includes:

duty cycle module operably coupled to produce a duty cycle controlled output oscillation based on a representation of the divided output oscillation and a duty cycle setting signal; and jitter reduction module operably coupled to produce a low jitter output oscillation from the duty cycle controlled output oscillation based on the input oscillation and the duty cycle setting signal; and scaling module operably coupled to produce the scaling signal based on a selected divider value.

14. The RFIC of claim 13, wherein the retiming module further comprises;

sample module operably coupled to sample an output of a last one of the plurality of load logic gates based on the input oscillation to produce a low delay pulse train having a rate that corresponds to a rate of the divided output oscillation, wherein the sample module provides the low delay pulse train to the duty cycle module as the representation of the divided output oscillation.

15. The RFIC of claim 14, wherein the duty cycle module further comprises:

a flip-flop having a data input, an output, a clock input, and a reset input, wherein the data input of the flip-flop is coupled to a logic one source, wherein the clock input is coupled to receive the low delay pulse train, and the reset input is operably coupled to receive the duty cycle setting signal.

16. The RFIC of claim 14, wherein the sample module further comprises:

a flip-flop having a data input, an output and a clock input, wherein the data input is operably coupled to receive the output of a last one of the plurality of load logic gates, the clock input is coupled to receive the input oscillation.

17. The RFIC of claim 14, wherein the jitter reduction module further comprises:

flip-flop having a data input, an output, a clock input, and a reset input, wherein the data input is coupled to receive the duty cycle controlled output oscillation, the clock input is coupled to receive the input oscillation, and the reset input is coupled to receive the duty cycle setting signal.

18. The RFIC of claim 17, wherein the retiming module further comprises:

logic circuitry operably coupled to produce the duty cycle setting signal based on output of at least one intermediary load logic gate of the plurality of load logic gates.

* * * * *

UNITED STATES PATENT AND TRADEMARK OFFICE
CERTIFICATE OF CORRECTION

PATENT NO. : 7,170,965 B2  Page 1 of 1
APPLICATION NO. : 10/406178
DATED : January 30, 2007
INVENTOR(S) : Hung-Ming Ed Chien

It is certified that error appears in the above-identified patent and that said Letters Patent is hereby corrected as shown below:

Column 9, line 23, in Claim 2: replace "off" with --of--.

Column 12, line 2, in Claim 14: replace "comprises;" with --comprises:--.

Signed and Sealed this

Seventeenth Day of February, 2009

JOHN DOLL
*Acting Director of the United States Patent and Trademark Office*